(12) United States Patent
Lee et al.

(10) Patent No.: US 12,382,592 B2
(45) Date of Patent: Aug. 5, 2025

(54) ELECTRONIC DEVICE INCLUDING VENT STRUCTURE AND HEAT DISSIPATION STRUCTURE

(71) Applicant: SAMSUNG ELECTRONICS CO., LTD., Suwon-si (KR)

(72) Inventors: Seunghoon Lee, Suwon-si (KR); Jongkyun Im, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 374 days.

(21) Appl. No.: 17/969,535

(22) Filed: Oct. 19, 2022

(65) Prior Publication Data

US 2023/0122743 A1 Apr. 20, 2023

Related U.S. Application Data

(63) Continuation of application No. PCT/KR2022/014826, filed on Sep. 30, 2022.

(30) Foreign Application Priority Data

Oct. 19, 2021 (KR) .................. 10-2021-0139551
Nov. 18, 2021 (KR) .................. 10-2021-0159267

(51) Int. Cl.
 *H05K 5/02* (2006.01)
 *G02B 27/01* (2006.01)
 *H05K 7/20* (2006.01)

(52) U.S. Cl.
 CPC ....... *H05K 5/0213* (2013.01); *G02B 27/0176* (2013.01); *H05K 7/20963* (2013.01); *G02B 2027/0178* (2013.01)

(58) Field of Classification Search
 CPC ............ H05K 5/0213; H05K 7/20963; H05K 7/20972; H05K 7/20954; H05K 5/0215;
(Continued)

(56) References Cited

U.S. PATENT DOCUMENTS 8,258,013 B1 * 9/2012 Nagarajan ............. H01L 23/564
 438/106
9,545,030 B2 * 1/2017 Nikkhoo ................. G06F 3/011
(Continued)

FOREIGN PATENT DOCUMENTS

CN 112824954 5/2021
EP 3582474 12/2019
(Continued)

OTHER PUBLICATIONS

Search Report and Written Opinion dated Dec. 14, 2022 issued in International Patent Application No. PCT/KR2022/014826.
(Continued)

*Primary Examiner* — Adam B Dravininkas
(74) *Attorney, Agent, or Firm* — Nixon & Vanderhye P.C.

(57) ABSTRACT

A wearable electronic device according to various embodiments disclosed herein may include: a housing, a printed circuit board on which a processor is disposed, a display module including a display, a vent hole disposed at the housing, a connection member comprising a conductor and including a vent region facing the vent hole and electrically connecting the printed circuit board and the display module, a heat dissipation member comprising a material having high thermal conductivity and disposed at the connection member and at least a part of which covers at least a part of the vent region, and a vent bracket including a vent channel connected to the vent hole and is disposed between the heat dissipation member and the vent hole.

18 Claims, 17 Drawing Sheets

(58) Field of Classification Search
CPC .... H05K 5/0214; H05K 5/0216; G06F 1/163; G06F 1/203; G02B 27/0176; G02B 2027/0178; G02B 7/008; G02B 27/0172
See application file for complete search history.

(56) References Cited

U.S. PATENT DOCUMENTS

| | | | |
|---|---|---|---|
| 9,986,667 | B2 | 5/2018 | Nikkhoo et al. |
| 10,389,007 | B1 | 8/2019 | Choi et al. |
| 10,444,515 | B2 | 10/2019 | Nikkhoo et al. |
| 10,852,552 | B2 * | 12/2020 | Kimura .................. G03B 21/16 |
| 10,986,303 | B2 | 4/2021 | Totani et al. |
| 11,042,201 | B2 | 6/2021 | Chang et al. |
| 2005/0286228 | A1 * | 12/2005 | Kim .................. H05K 7/20963 361/704 |
| 2010/0330758 | A1 | 12/2010 | Kim et al. |
| 2016/0212879 | A1 | 7/2016 | Nikkhoo et al. |
| 2017/0086317 | A1 * | 3/2017 | Pelletier ............... H05K 5/0213 |
| 2017/0184863 | A1 * | 6/2017 | Balachandreswaran ................... G02B 27/0176 |
| 2018/0052501 | A1 * | 2/2018 | Jones, Jr. ........... G02B 27/0081 |
| 2018/0301790 | A1 | 10/2018 | Kim et al. |
| 2018/0307282 | A1 * | 10/2018 | Allin ................. G02B 27/0176 |
| 2019/0075689 | A1 * | 3/2019 | Selvakumar ......... G02B 27/017 |
| 2019/0107870 | A1 | 4/2019 | Ali |
| 2020/0073450 | A1 * | 3/2020 | Maric ................ G02B 27/0176 |
| 2020/0078670 | A1 * | 3/2020 | Oh ..................... H05K 7/20172 |
| 2020/0110449 | A1 * | 4/2020 | Chang ............... H05K 7/20172 |
| 2020/0252575 | A1 * | 8/2020 | Totani ...................... H04N 5/64 |
| 2020/0310138 | A1 | 10/2020 | Kamakura |
| 2020/0310140 | A1 | 10/2020 | Kamakura |
| 2021/0080732 | A1 | 3/2021 | Hoover et al. |
| 2021/0303024 | A1 * | 9/2021 | Kuo ........................ G06F 1/203 |

FOREIGN PATENT DOCUMENTS

| | | |
|---|---|---|
| EP | 3876023 | 9/2021 |
| JP | 2017-146335 | 8/2017 |
| JP | 6696203 | 5/2020 |
| JP | 2021-158662 | 10/2021 |
| KR | 10-2020-0002997 | 1/2020 |

OTHER PUBLICATIONS

Extended European Search Report dated Oct. 9, 2024 issued in European Patent Application No. 22883824.9.

* cited by examiner

US 12,382,592 B2

ELECTRONIC DEVICE INCLUDING VENT STRUCTURE AND HEAT DISSIPATION STRUCTURE

CROSS-REFERENCE TO RELATED APPLICATIONS

This application is a continuation of International Application No. PCT/KR2022/014826 designating the United States, filed on Sep. 30, 2022, in the Korean Intellectual Property Receiving Office and claiming priority to Korean Patent Application No. 10-2021-0139551, filed on Oct. 19, 2021, in the Korean Intellectual Property Office, and to Korean Patent Application No. 10-2021-0159267, filed on Nov. 18, 2021, in the Korean Intellectual Property Office, the disclosures of all of which are incorporated by reference herein in their entireties.

BACKGROUND

Field

The disclosure relates to an electronic device including a vent structure and a heat dissipation structure.

Description of Related Art

An electronic device may include an air vent connecting the inner space of the electronic device and the outer space of the electronic device. The air vent may be used to form a structure in which inner air and outer air circulate.

The air vent may be used for various purposes, including a function for discharging heat from inside the electronic device to the outside, or maintaining the atmosphere pressure inside the electronic device at a predetermined level.

Meanwhile, there may be an electronic component that generates heat while operating, among various electronic components included in the electronic device. If heat generated by the electronic component is not controlled, the heat may damage the electronic component or damage the user's body. In order to control heat from the electronic device, the performance of the electronic component may be partially limited (for example, throttling). Such an approach may effectively control heat, and the limited performance may degrade usability.

Electronic devices tend to become compact and include an increasing number of electronic components, and the inner space of electronic devices are gradually reduced. The reduced inner space may make it difficult to remove generated heat.

In addition, electronic devices commonly made of synthetic resin materials in view of wearing convenience (for example, wearable electronic devices) may have few heat transfer means.

SUMMARY

Embodiments of the disclosure provide a heat dissipation structure wherein a heat dissipation member is disposed on a connection member that connects electrical objects, and the heat dissipation member extends through a vent hole that connects inner and outer spaces of an electronic device, thereby dissipating heat transferred to the heat dissipation member.

A wearable electronic device according to various example embodiments disclosed herein may include: a housing, a printed circuit board on which a processor is disposed, a display module comprising a display, a vent hole disposed in the housing, a connection member comprising a conductor and including a vent region facing the vent hole and electrically connecting the printed circuit board and the display module, a heat dissipation member comprising a heat conducting material disposed at the connection member and at least a part of which covers the vent region, and a vent bracket including a vent channel connected to the vent hole and is disposed between the heat dissipation member and the vent hole.

An electronic device according to various example embodiments disclosed herein may include: a housing, a printed circuit board on which a processor is disposed, an electronic component disposed to be spaced apart from the printed circuit board, a vent hole disposed at the housing, a connection member comprising a conductor and including a vent region facing the vent hole and electrically connecting the printed circuit board and the electronic component; and a heat dissipation member comprising a heat conducting material disposed at the connection member and at least a part of which covers the vent region.

Various example embodiments disclosed herein may provide a structure capable of effectively controlling heat generated by an electronic device, even in the case of an electronic device which has a narrow inner space, which mainly includes a synthetic resin material, and which thus has few heat dissipation means.

BRIEF DESCRIPTION OF THE DRAWINGS

In connection with the description of the drawings, the same or similar reference numerals may be used for the same or similar components. Further, the above and other aspects, features and advantages of certain embodiments of the present disclosure will be more apparent from the following detailed description, taken in conjunction with the accompanying drawings, in which.

DETAILED DESCRIPTION

Figure 1:
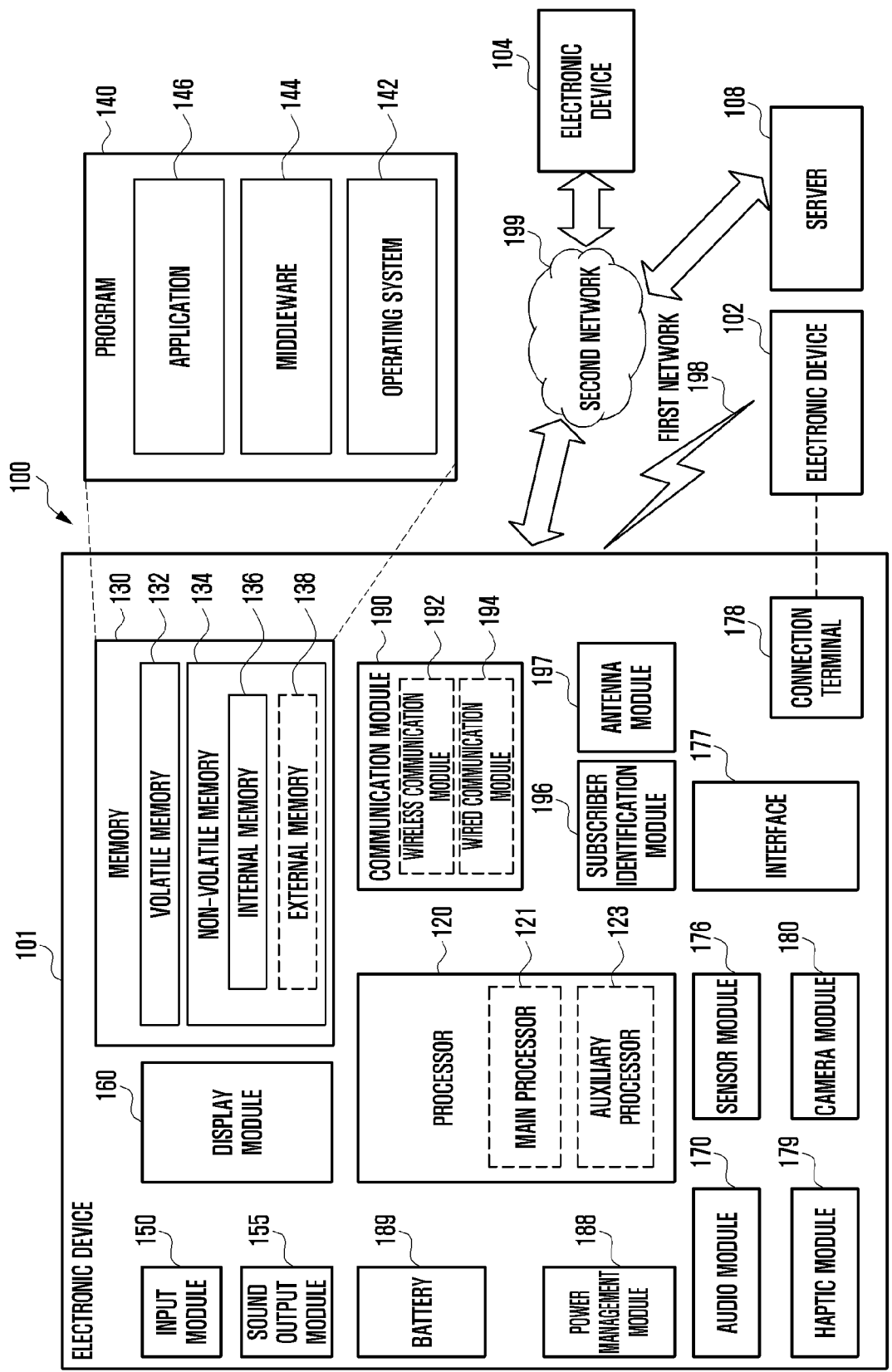
FIG. 1 is a block diagram illustrating an example electronic device in a network environment according to various embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

FIG. 1 is a block diagram illustrating an example electronic device in a network environment according to various embodiments. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
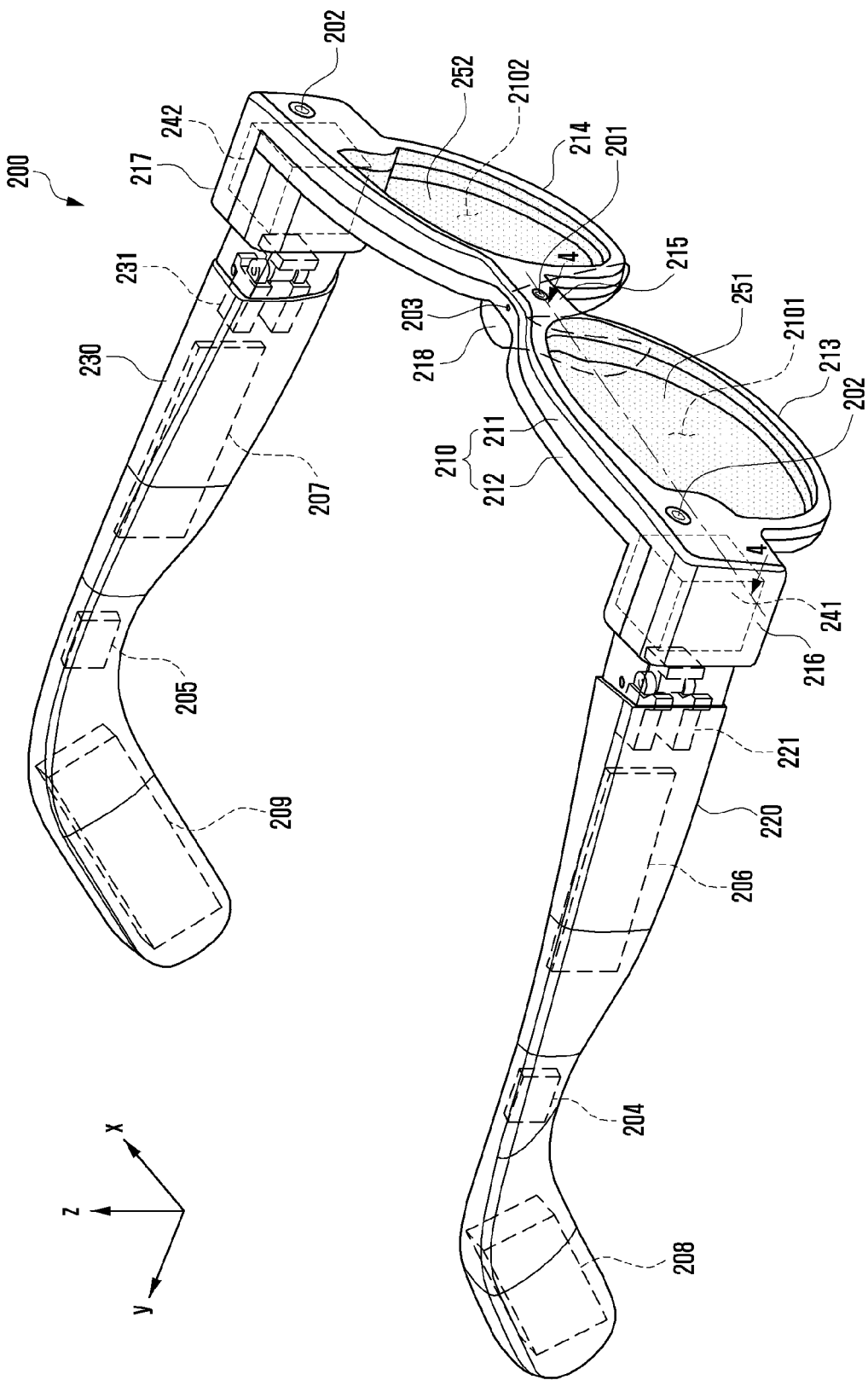
FIG. 2 is a perspective view of a wearable electronic device according to various embodiments.

FIG. 2 is a perspective view of a wearable electronic device according to various embodiments.

A wearable electronic device 200 in FIG. 2 may be at least partially similar to an electronic device 101 in FIG. 1 or may further include other embodiments of an electronic device.

Referring to FIG. 2, the wearable electronic device 200 (e.g., an electronic device) may include a housing 210 including a first rim housing 211 and a second rim housing 212 coupled with the first rim housing 211 and a pair of temples 220 and 230 rotatably coupled to opposite ends of the housing 210, respectively. According to an embodiment, the housing 210 may be configured, for wearability, of a material such as a polymer (e.g., plastic). In an embodiment, the housing 210 may be configured of various materials such as metal, ceramic, or FRP (e.g., glass fiber reinforced plastic (GFRP) or carbon fiber reinforced plastic (CFRP)) in consideration of weight, strength, or an aesthetic appearance. According to an embodiment, the housing 210 may be an eyeglasses type and include a first rim 213 including a first opening 2101 and a second rim 214 including a second opening 2102, and a bridge 215 configured to connect the first rim 213 and the second rim 214. According to an embodiment, the housing 210 may include a first end piece 216 disposed at an end portion of the first rim 213 to be connected with the first temple 220 via a first hinge structure 221, and a second end piece 217 disposed at an end portion of the second rim 214 to be connected with the second temple 230 via a second hinge device 231. According to an embodiment, the wearable electronic device 200 may include a nose pad 218 disposed at at least a part of the bridge 215 and disposed to be placed over the nose of a user. In an embodiment, the nose pad 218 may be integrally configured with the bridge 215. According to an embodiment, the wearable electronic device 200 may include a first optical unit 251 disposed to correspond to the first opening 2101 of the first rim 213 and a second optical unit 252 disposed to correspond to the second opening 2102 of the second rim 214. According to an embodiment, the first optical unit 251 may be disposed in a space (e.g., a first space 210a in FIG. 3) between a first rear visor (e.g., a first rear visor 255 in FIG. 3) and a first front visor (e.g., a first front visor 253 in FIG. 3) disposed via the first rim 213. According to an embodiment, the second optical unit 252 may be disposed in a space between a second rear visor (e.g., a second rear visor 256 in FIG. 3) and a second front visor (e.g., a second front visor 254 in FIG. 3) disposed via the second rim 214. According to an embodiment, the first optical unit 251 may include an optical lens (wave guide) with a total-reflection condition for transferring image information provided via a first display module 241 disposed at the first end piece 215 to a user. According to an embodiment, the second optical unit 252 may include an optical lens (wave guide) with a total-reflection condition for transferring image information provided via a second display module 242 disposed at the second end piece 217 to a user. According to an embodiment, the wearable electronic device 200 may be worn on a head part of a user in a manner in which the first temple 220 and the second temple 230 are placed over the ears of the user while being unfolded and the nose pad 218 are placed over the nose of the user. In this case, the first optical unit 251 may be positioned to correspond to the right eye of a user and the second optical unit 252 may be positioned to correspond to the left eye of the user so as to output image information provided from the first display module 241 and the second display module 242 to be seen by the user. In an embodiment, the first temple 220 and the second temple 230 may be replaced with a hanging member designed to surround at least a part of the head part of a user. According to an embodiment, the hanging member may include various other wearing structures such as helmets or straps coupled to the housing 210 to be wearable on the head part.

According to various embodiments, the wearable electronic device 200 may include smartglasses (or smart glasses). For example, the wearable electronic device 200 may include wearable computer glasses which provide augmented reality that adds visual information to the foreground that is actually visible to the user. According to an embodiment, augmented reality may provide various video information obtained by synthesizing a virtual image with a preview image of an actual space or object. For example, the wearable device 200 may synthesize, in the augmented reality mode, the virtual image displayed on the first optical unit 251 and the second optical unit 252 with the actually visible foreground image to provide the same to the user.

According to various embodiments, the first optical unit 251 and the second optical unit 252 may include an optical waveguide totally reflecting (total internal reflection (TIR)) light provided from the light source of the first display module 241 and the second display module 242. According to an embodiment, the optical waveguide may be made of, for example, glass or a polymer and may include a nano pattern (e.g., a grating structure having a curved or polygonal shape) disposed on the surface thereof or the inside thereof. In an embodiment, the first display module 241 and the second display module 242 may include a projector which projects light related to an image onto the first optical unit 251 and the second optical unit 252. According to an embodiment, the first optical unit 251 and the second optical unit 252 may include a see-through type transparent display. The see-through type transparent display may include, for example, a transparent organic light-emitting diode (OLED) display, a transparent micro-LED, a transparent liquid crystal display (LCD), or a transparent thin-film electroluminescence method.

According to various embodiments, the wearable electronic device 200 may include a first camera module 201, a plurality of second camera modules 202, audio modules 203, 204, and 205, a first substrate 206, a second substrate 207, a first battery 208, or a second battery 209. In an embodiment, the wearable electronic device 200 may be implemented by including at least a part of elements included in the electronic device 101 in FIG. 1 or additionally including other elements. The position or shape of the elements included in the wearable electronic device 200 may be variously changed without being limited by the example illustrated in FIG. 2.

According to various embodiments, the first camera module 201 or the plurality of second camera modules 202 may include, for example, one or more lenses, an image sensor, and/or an image signal processor. In an embodiment, the first camera module 201 may be located at the bridge 215 and may obtain image data related to the foreground (e.g., an actual image). The position or number of the first camera module 201 are not limited to the illustrated example and may vary. In an embodiment, the plurality of second camera modules 202 may measure the depth of field (DOF). The wearable electronic device 200 may use the depth of field (e.g., 3DOF or 6DOF) obtained via the plurality of second camera modules 202 to perform various functions such as head tracking, hand detection or tracking, gesture 5 recognition, or spatial recognition. The plurality of second camera modules 202 may include, for example, a global shutter (GS) camera or a rolling shutter (RS) camera and the position and number thereof may vary without being limited by the illustrated example.

According to various embodiments, the wearable electronic device 200 may include an eye tracking module. The eye tracking module may track a user's gaze using at least one of an EOG sensor (electro-oculography or electrooculogram), coil system, dual Purkinje system, bright pupil systems, or dark pupil systems. The eye tracking module may include at least one camera (e.g., a micro-camera or an IR LED) positioned at the housing 210 (e.g., the first rim 213, the second rim 214, or the bridge 215) to track the gaze of a wearer.

According to various embodiments, the wearable electronic device 200 may include at least one light-emitting element (not illustrated). For example, the light-emitting element may provide the status information of the wearable electronic device 200 in an optical form. In another example, the light-emitting element may provide a light source interlocked with the operation of a camera module. The light-emitting element may include, for example, an LED, an IR LED, or a xenon lamp.

According to various embodiments, the audio modules 203, 204, and 205 may include a first audio module 203 related to a microphone, a second audio module 204 related to a first speaker, and a third audio module 205 related to a second speaker. In an embodiment, the first audio module 203 may include a microphone hole disposed on a bridge 215 of the housing 210 and a microphone positioned inside the bridge 215 to correspond to the microphone hole. The position and number of the first audio module 203 related to the microphone are not limited to the illustrated example and may vary. In an embodiment, the wearable electronic device 200 may detect the direction of sound using the plurality of microphones. In an embodiment, the second audio module 204 may include the first speaker positioned inside the first temple 220 and the third audio module 205 may include the second speaker positioned inside the second temple 230. The first speaker or the second speaker may be, for example, a piezo speaker (e.g., a bone conduction speaker) implemented without a speaker hole. The second audio module 204 related to the first speaker or the third audio module 205 related to the second speaker may be implemented in various other ways.

According to various embodiments, the first substrate 206 may be positioned inside the first temple 220 and the second substrate 207 may be positioned inside the second temple 230. The first substrate 206 and/or the second substrate 207 may include, for example, a printed circuit board (PCB), a flexible PCB (FPCB), or a rigid-flexible PCB (RFPCB). In an embodiment, the first substrate 206 or the second substrate 207 may include a main PCB, a slave PCB disposed to partially overlap the main PCB, and/or an interposer substrate between the main PCB and the slave PCB. The first substrate 206 or the second substrate 207 may include various electronic components (e.g., at least a part of the elements included in the electronic device 101 in FIG. 1) such as a processor (e.g., the processor 120 in FIG. 1), a memory (e.g., the memory 130 in FIG. 1), a communication module (e.g., the communication module 190 in FIG. 1), or an interface (e.g., the interface 177 in FIG. 1). The first substrate 206 or the second substrate 207 may be electrically connected to other elements using an electrical path such as a cable or a flexible printed circuit board positioned in the housing 210. In an embodiment, one of the first substrate 206 and the second substrate 208 may be omitted.

According to various embodiments, the first battery 208 may be positioned inside the first temple 220 and the second battery 209 may be positioned inside the second temple 230. The first battery 208 and the second battery 209 are devices (e.g., the battery 189 in FIG. 1) for supplying power to the elements of the wearable electronic device 200 and may include, for example, a non-rechargeable primary battery, a rechargeable secondary battery, or a fuel cell. In an embodiment, the first battery 208 and the second battery 209 may be implemented to be detachable from the housing 210. In an embodiment, one of the first battery 208 and the second battery 209 may be omitted. The positions or numbers of the batteries 208 and 209 are not limited to the illustrated example and may vary.

According to various embodiments, the wearable electronic device 200 may include a sensor module (e.g., the sensor module 176 in FIG. 1). The sensor module may generate an electrical signal or a data value corresponding to an internal operating state of the wearable electronic device 200 or an external environmental state. The sensor modules may further include, for example, at least one of a gesture sensor, a gyro sensor, an atmospheric pressure sensor, a magnetic sensor, an acceleration sensor, a grip sensor, a color sensor, an infrared (IR) sensor, a biometric sensor module (e.g., an HRM sensor), a temperature sensor, a humidity sensor, or an illuminance sensor. In an embodiment, the sensor module may recognize biometric information of a user using various biometric sensors (or, biometric recognition sensors) such as an e-nose sensor, an electromyography (EMG) sensor, an electroencephalogram (EEG) sensor, an electrocardiogram (ECG) sensor, or an iris sensor. In an embodiment, the sensor module may further include at least one control circuit for controlling at least one sensor included therein.

According to various embodiments, the wearable electronic device 200 may include an input module (e.g., the input module 150 in FIG. 1). The input module may include, for example, a touch pad or a button. The touch pad may recognize a touch input using at least one of, for example, an electrostatic type, a pressure-sensitive type, an infrared type, or an ultrasonic type method. The touch pad may further include a tactile layer or may provide a tactile reaction to a user. The button may include, for example, a physical button, an optical key, or a keypad. The input module may include various other types of user interfaces. In an embodiment, the input module may include at least one of sensor module. In an embodiment, the button may be disposed at at least one of temple 220 and 230 rims 213 and 214, and/or the bridge 215.

According to various embodiments, the wearable electronic device 200 may include a connection terminal (e.g., the connection terminal 178 in FIG. 1). The connection terminal may include a connector by which the wearable electronic device 200 can be physically connected to an external electronic device (e.g., the electronic device 102 in FIG. 1).

According to various embodiments, the wearable electronic device 200 may include at least one antenna (e.g., the antenna module 197 in FIG. 1). For example, the antenna may include a legacy antenna, mmWave antenna, a near field communication (NFC) antenna, a wireless charging antenna, and/or a magnetic secure transmission (MST) antenna. For example, the antenna may perform short-range communication with an external electronic device, or may transmit/receive power required for charging to/from the external device in a wireless manner. In an embodiment, the antenna may be implemented using a conductive unit part disposed to be segmented by a non-conductive segmentation part disposed at at least a portion of the housing 210 or temples 220 and 230 made of a conductive material.

Figure 3:
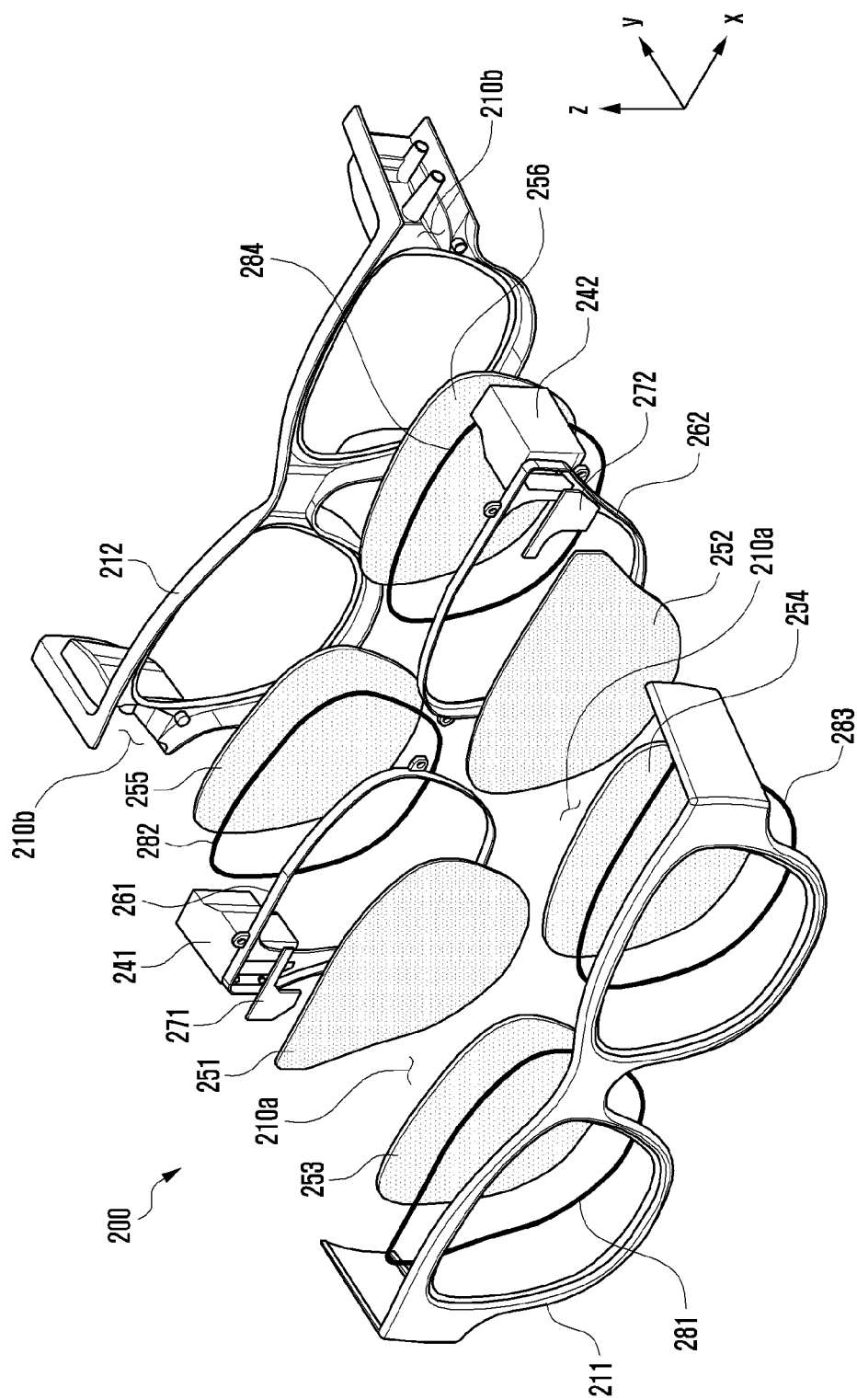
FIG. 3 is an exploded perspective view of a wearable electronic device according to various embodiments.

FIG. 3 is an exploded perspective view of a wearable electronic device according to various embodiments.

Referring to FIG. 3, the wearable electronic device 200 may include a housing (e.g., the housing 210 in FIG. 2) and a pair of temples (e.g., the first temple 220 and the second temple 230 in FIG. 2) foldably arranged on opposite ends of the housing 210. According to an embodiment, the housing 210 may include a first rim 5 housing 211 facing a first direction (e.g., a −y-axis direction) and a second rim housing 212 coupled to the first rim housing 211 and facing a second direction (e.g., a y-axis direction) opposite to the first direction. According to an embodiment, the housing 210 may include, via coupling the first rim housing 211 and the second housing 212, for example, a pair of rims (e.g., the rims 213 and 214 in FIG. 2) and end pieces (e.g., the end pieces 216 and 217) configured to extend from the respective rims 213 and 214 to be coupled to the temples 220 and 230 like a structure of glasses.

According to various embodiments, the wearable electronic device 200 may include a first bracket 261 disposed at a position corresponding to a first rim (e.g., the first rim 213 in FIG. 2) and a second bracket 262 disposed at a position corresponding to a second rim (e.g., the second rim 214 in FIG. 2) in a first space (e.g., the first space 210a in FIG. 3) between the first rim housing 211 and the second rim housing 212. According to an embodiment, the first bracket 261 and the second bracket 262 may be integrally formed to be connected to each other. According to an embodiment, the wearable electronic device 200 may include a first optical unit 251 disposed between the first bracket 261 and the first rim housing 211 and the second optical unit 252 disposed between the second bracket 262 and the first rim housing 211. According to an embodiment, the wearable electronic device 200 may include a first display module 241 and a second display module 242 arranged in a second space (e.g., the second space 210b in FIG. 3) provided to be adjacent to a first space (e.g., the first space 210a in FIG. 3), and configured by the first rim housing 211 and the second rim housing 212. According to an embodiment, at least a part of the first display module 241 may be supported by the first bracket 261 and may be disposed to face at least a part of the first optical unit 251. According to an embodiment, at least a part of the second display module 242 may be supported by the second bracket 262 and may be disposed to face at least a part of the second optical unit 252. For example, the first display module 241 and the second display module 242 may be arranged in inner spaces (e.g., the second space 210b in FIG. 3) of the first end piece (e.g., the first end piece 216 in FIG. 2) and the second end piece (e.g., the second end piece 217 in FIG. 2) of the housing 210. In an embodiment, the first bracket 261 and the second bracket 262 may be made of a polymer (e.g., PC) material. In an embodiment, the first bracket 261 and the second bracket 262 may be made of a metallic material. In this case, the first bracket 261 and the second bracket 262 made of a metallic material may help the heat dissipation action of diffusing the heat generated from the first display module 241 and the second display module 242. According to an embodiment, the wearable electronic device 200 may include a first light refraction member 271 (e.g., a first prism) disposed between the first optical unit 251 and the first bracket 261 to transfer the light source of the first display module 241 to the first optical unit 251. According to an embodiment, the wearable electronic device 200 may include a second light refraction member 272 (e.g., a second prism) disposed between the second optical unit 252 and the second bracket 262 to transfer the light source of the second display module 242 to the second optical unit 252. According to an embodiment, the first light refraction member 271 and the second light refraction member 272 may have a refractive index for changing the incident angle so that the light emitted from the light source of the first display module 241 and the second display module 242 has an angle of 90 degrees and is incident to the first optical unit and the second optical unit 252. The first light refraction member 271 and the second light refraction member 272 may be made of a glass or transparent polymer material having a predetermined refractive index.

According to various embodiments, the wearable electronic device 200 may include, at a position corresponding to a first rim (e.g., the first rim 213 in FIG. 2), a first front visor 253 fixed to the first rim housing 211 and the first rear visor 255 fixed to the second rim housing 212. According to an embodiment, the first optical unit 251 may be disposed in a space (e.g., the first space 210a in FIG. 3) between the first front visor 253 and the first rear visor 255. According to an embodiment, the wearable electronic device 200 may include, at a position corresponding to a second rim (e.g., the second rim 214 in FIG. 2), a second front visor 254 fixed to the first rim housing 211 and the second rear visor 256 fixed to the second rim housing 212. According to an embodiment, the second optical unit 252 may be disposed in a space (e.g., the first space 210a in FIG. 3) between the second front visor 254 and the second rear visor 256. According to an embodiment, the front visors 253 and 254 and the rear visors 255 and 256 are made of a material which moves the focal length so as to be configured to have a curved surface so that the image formed on the optical units 251 and 252 can be confirmed by the naked eye of the user. For example, the front visors 253 and 254 and the rear visors 255 and 256 may be made of a transparent PC or glass.

According to various embodiments, the wearable electronic device 200 may have a sealing structure for protecting the first optical unit 251 and the second optical unit 252 arranged in the inner space of the housing 210 from external foreign substances and/or moisture. According to an embodiment, the wearable electronic device 200 may include a first sealing member 281 disposed between the first rim housing 211 and the first bracket 261 and a second sealing member 282 disposed between the first bracket 261 and the first rear visor 255. According to an embodiment, the wearable electronic device 200 may include a third sealing member 283 disposed between the first rim housing 211 and the second bracket 262 and a fourth sealing member 284 disposed between the second bracket 262 and the second rear visor 256. The first, second, third, and fourth sealing members 281, 282, 283, and 284 are compressible members and may be made of, for example, a material such as compressible tape, sponge, silicone, rubber, or urethane. According to an embodiment, the wearable electronic device 200 may include a sealed space provided for the first optical unit 251 and the second optical unit 252 via the first, second, third, and fourth sealing members 281, 282, 283, and 284, the brackets 261 and 262, the first rim housing 211, and the first and second rear visors 255 and 256.

Figure 4:
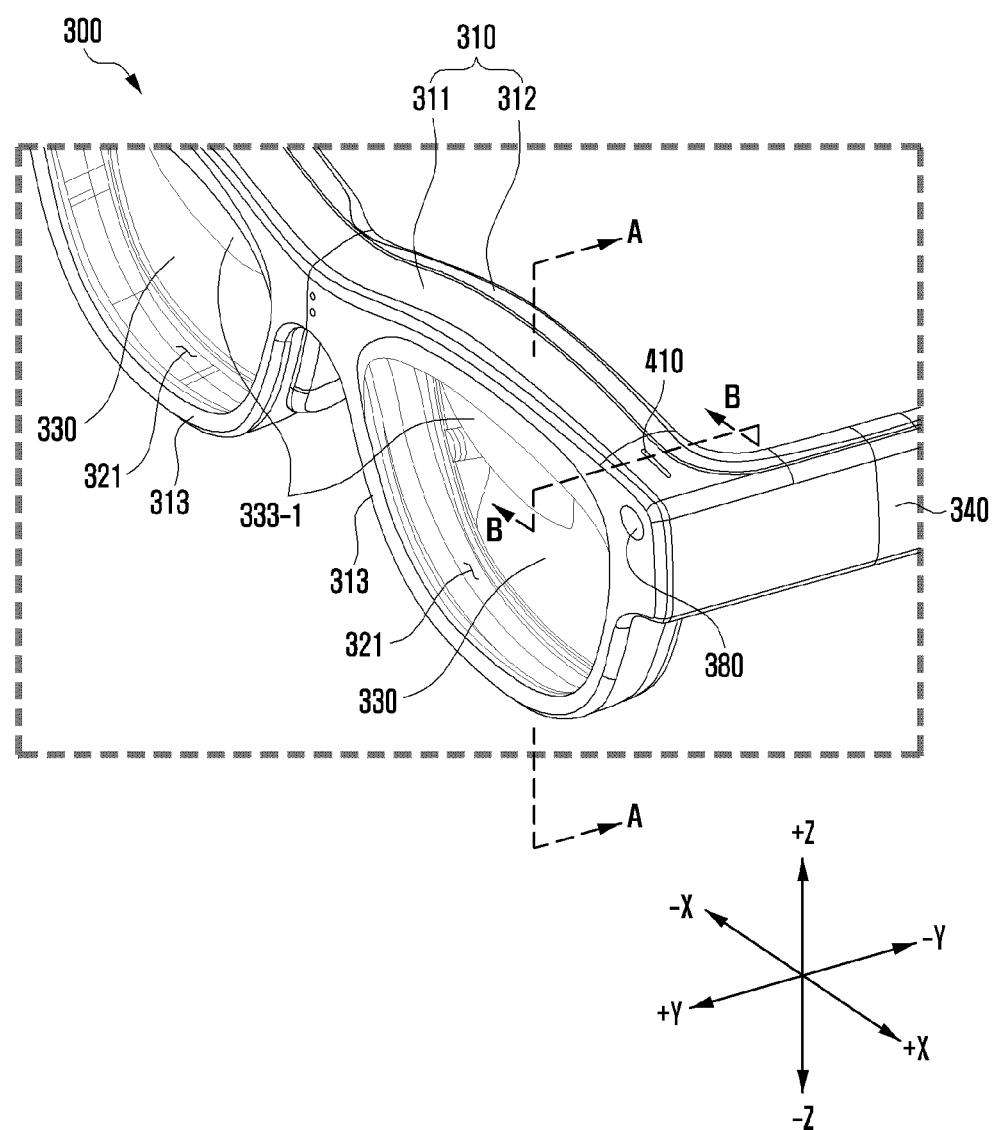
FIG. 4 is a perspective view illustrating one side surface of an electronic device according to various embodiments.
Figure 5:
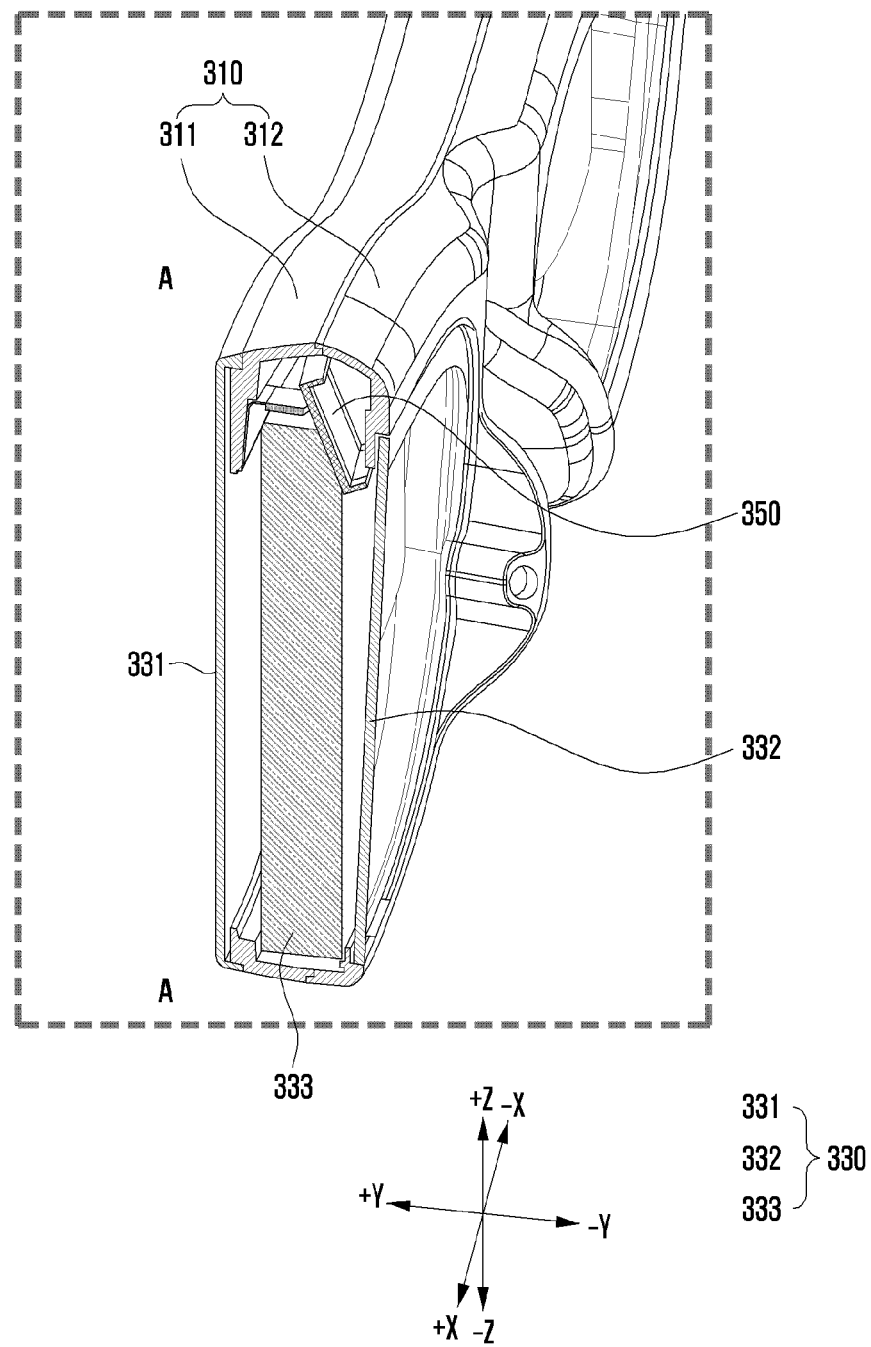
FIG. 5 is a sectional perspective view illustrating an electronic device taken along line A-A of FIG. 4 according to various embodiments.
Figure 6:
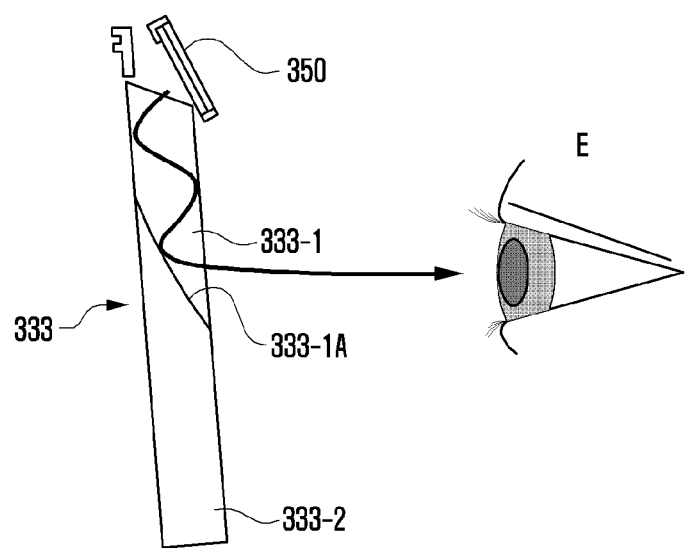
FIG. 6 is a diagram illustrating a process in which light generated by a display module is incident to an eye of a user in an electronic device according to various embodiments.

FIG. 4 is a perspective view illustrating one side surface of an electronic device according to various embodiments. FIG. 5 is a sectional perspective view illustrating an electronic device taken along line A-A of FIG. 4 according to various embodiments. FIG. 6 is a diagram illustrating a process in which light generated by a display module is incident to an eye of a user in an electronic device according to various embodiments.

The electronic device of FIG. 4 may include at least one of elements of the electronic device 101 illustrated in FIG. 1. The electronic device of FIG. 4 may be an electronic device having a form (e.g., a glasses-type electronic device) similar to the electronic device 200 illustrated in FIG. 2 and FIG. 3. Unless otherwise stated, it may be understood that the elements of the electronic device 400 illustrated in FIG. 4 are the same or similar to the elements of FIG. 2 and FIG. 3.

Referring to FIG. 4, an electronic device 300 may include a housing 310 (e.g., the housing 210 in FIG. 2) and a temple 340 (e.g., the temples 220 and 230 in FIG. 2) rotatably connected to the housing 310. A part of elements of the electronic device 300 may be configured as a pair with respect to the center (e.g., the center in an X-axis direction in FIG. 4) of the electronic device 300. For example, a temple 340, a rim 320, an optical unit 330, a camera module 380, and a display module 350 may be configured as a pair.

In various embodiments, the housing 310 may include a plurality of elements. For example, the housing 310 may include a first rim housing 311 (e.g., the first rim housing 211 in FIG. 2), a second rim housing 312 (e.g., the second rim housing 212 in FIG. 2), and a rim 313 (e.g., the rims 213 and 214 in FIG. 2). The first rim housing 311 may be coupled to the second rim housing 312 to form the housing 310. The first rim housing 311 may be coupled to the second rim housing 312 at a front surface (e.g., in a +Y direction in FIG. 4) of the second rim housing 312. In an embodiment, the rim 313 may be integrally formed with the first rim housing 311 or the second rim housing 312. An opening 321 may be configured by the rim 313 and the first rim housing 311 or the second rim housing 312.

In an embodiment, the optical unit 330 configured to correspond to the shape of the opening 321 may be disposed in the opening 321. Referring to FIG. 5, the optical unit 330 may include a front visor 331 and a rear visor 332. The front visor 331 may be disposed in the front surface (e.g., in the +Y direction in FIG. 5) of the optical unit 330 and the rear visor 332 may be disposed in the rear surface (e.g., the −Y direction in FIG. 5) of the optical unit 330. A lens unit 333 may be disposed between the front visor 331 and the rear visor 332. In an embodiment, the lens unit 333 may include a combiner 333-1 configured to transfer the light generated by the display module 350 to the eye of a user and a dummy lens 333-2 corresponding to the remaining parts except for the combiner 331-1. In an embodiment, the combiner 333-1 may be an optical lens having a total-reflection condition.

Although it is illustrated that the display module 350 (e.g., the display modules 241 and 242 in FIG. 3) of the electronic device is disposed in a side surface (e.g., the end pieces 216 and 217 in FIG. 3) of the electronic device 300 in FIG. 2 and FIG. 3 described above, the display module 350 may be disposed at the housing 310 of the electronic device 300 as illustrated in FIG. 5. For example, as illustrated in FIG. 5, the display module 350 may be disposed in a space provided between the first rim housing 311 and the second rim housing 312. In this case, the display module 350 may refer to an element which receives a control signal from a processor (e.g., the processor 120 in FIG. 1) of the electronic device 300 to generate light corresponding to the control signal. Referring to FIG. 5 and FIG. 6, the display module 350 may be arranged to be inclined by a predetermined angle so that the light generated by the display module 350 faces the combiner 333-1 of the lens unit 333 disposed between the front visor 331 and the rear visor 332.

In an embodiment, the light that has entered the inside of the combiner 333-1 from the display module 350 may be reflected by the surface of the combiner 333-1 and travel along the extension direction of the combiner 333-1. According to an embodiment, the angle of the light entering the combiner 333-1 from the display module 350 may be adjusted and the refractive index of the combiner 333-1 may be adjusted so that total reflection is made on the surface of the combiner 333-1. The combiner 333-1 may include a parting unit 333-1A. The parting unit 333-1A may be a part of the combiner 333-1. The parting unit 333-1A may include a part having a curved surface so that the light reflected by the combiner 333-1 is directed to the eye of a user. In summary, the light generated by the display module 350 disposed at the housing may enter the combiner 333-1 of the lens unit 333, travel along the surface of the combiner 333-1, and be reflected by the parting unit 333-1A of the combiner 333-1 to be transmitted to the eye (E) of the user.

According to various embodiments, the electronic device 300 may include a camera module 380 (e.g., the camera modules 201 and 202 in FIG. 2). The camera module 380 may be disposed at the housing 310 so as to capture the front side (e.g., the +Y direction in FIG. 4) of the electronic device 300. The electronic device 300 may include more camera modules in addition to the camera module 380 illustrated in FIG. 4. For example, the electronic device 300 may further include a camera module disposed to capture the eye of the user.

According to various embodiments, the electronic device 300 may include a vent hole 410. The vent hole 410 may be a hole for connecting the outside of the electronic device 300 and the inner space of the electronic device 300. The air (outside air) outside the electronic device 300 and the air (inside air) inside the electronic device 300 may be circulated through the vent hole 410, and the external pressure of the electronic device 300 and the internal pressure of the electronic device 300 can be adjusted to the similar level. The pressure difference between the outside and the inside of the electronic device 300 is reduced through the vent hole 410, and various problems (e.g., a fogging problem of the optical unit 300, a malfunction problem of a sensor (e.g., an atmospheric pressure sensor) included in electronic device 300, an unrestored problem of diaphragm included in speaker module) due to the pressure difference may be reduced.

In an embodiment, the vent hole 410 may be disposed at the housing 310 which supports the optical unit 330. The vent hole may be, for example, disposed at the first rim housing 311 as illustrated in FIG. 4. Since the vent hole 410 is disposed at the housing 310 which supports the optical unit 330, the fogging problem which may occur at the optical unit 330 due to the difference in pressure and temperature may be effectively reduced. The vent hole 410 may be configured in one direction. The vent hole 410 may be disposed on a surface other than the surface which comes into contact with the user's skin when the user wears the electronic device 300. The vent hole 410 may be disposed in a direction (e.g., the +Z direction with respect to FIG. 4) substantially perpendicular to the direction (e.g., the Y-axis direction in FIG. 4) in which the optical unit 330 faces, but is not limited thereto. The vent hole 410 may be disposed to face the −Z direction or the X-axis direction with respect to FIG. 4. Further, the number of vent holes 410 may be plural.

Figure 7A:
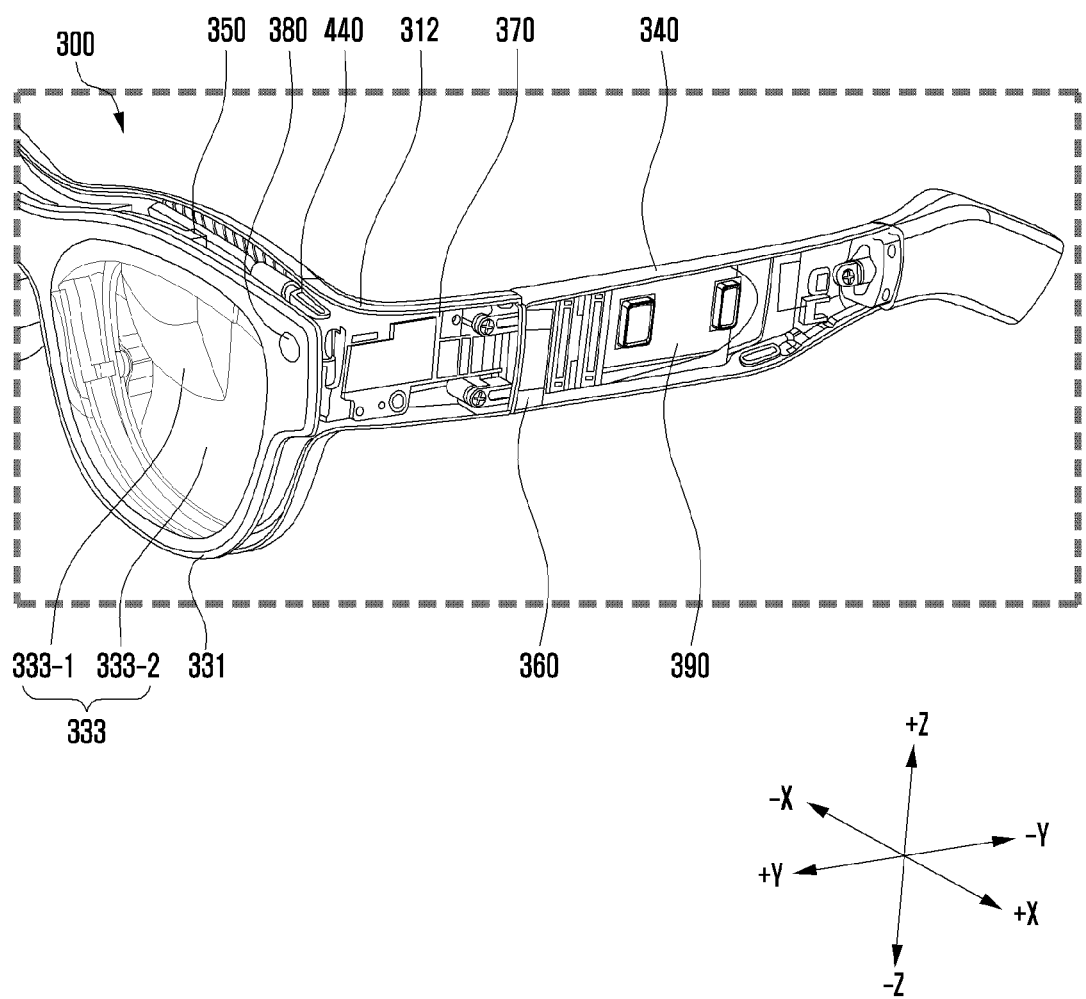
FIG. 7A is a perspective view illustrating the inside of an electronic device according to various embodiments.
Figure 7B:
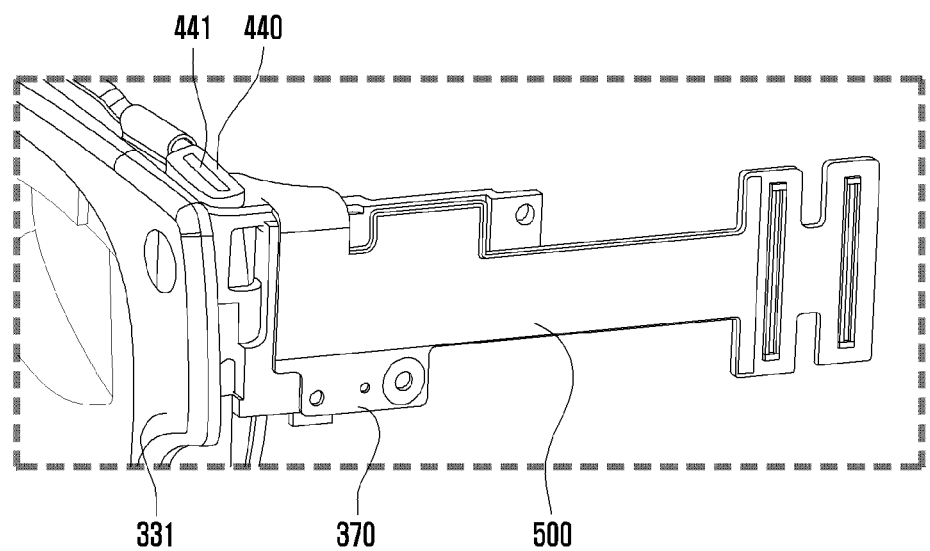
FIG. 7B is a perspective view illustrating shapes of a connection member and a heat dissipation member included in an electronic device according to various embodiments.
Figure 8A:
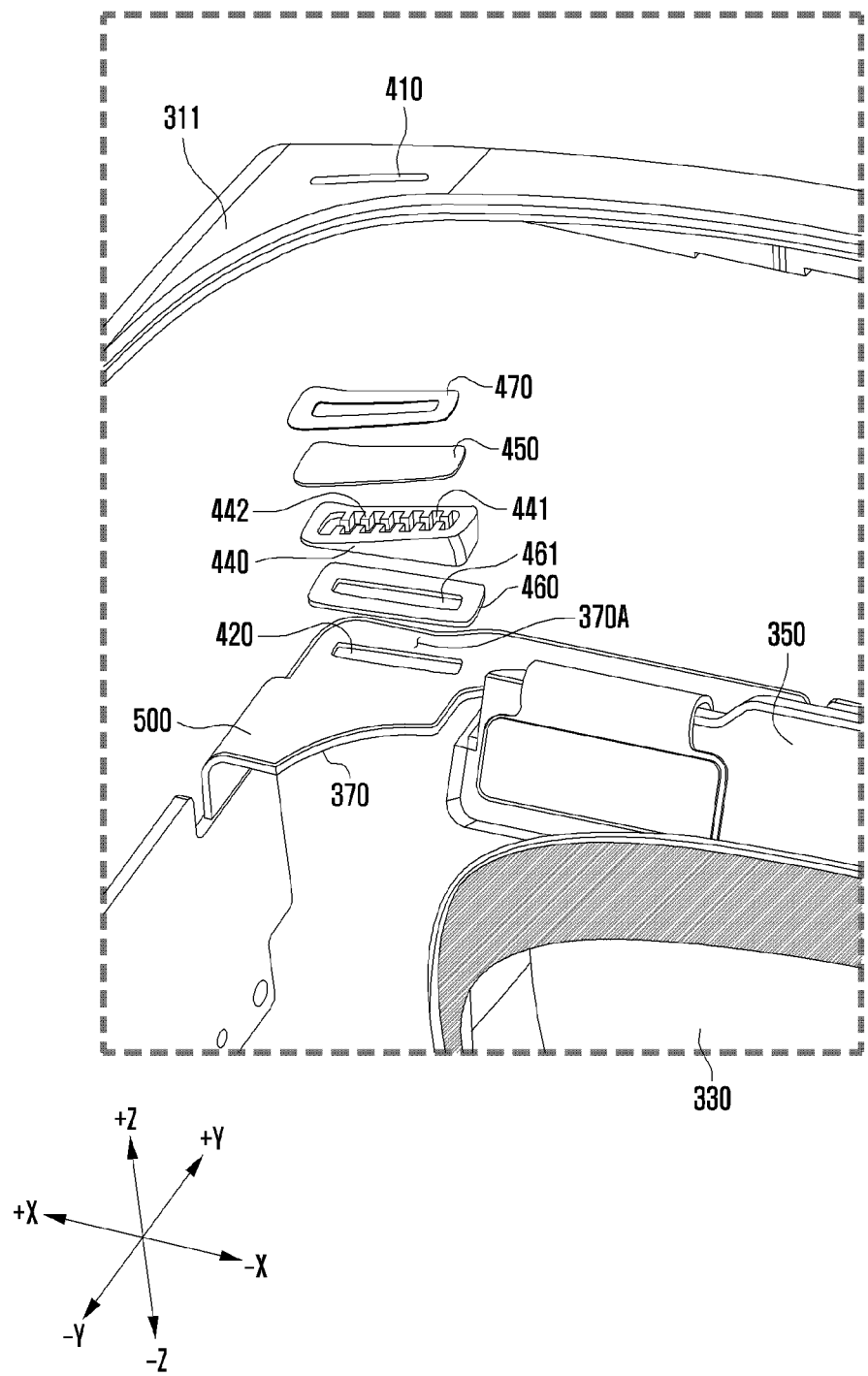
FIG. 8A and FIG. 8B are exploded perspective views of a part of elements of an electronic device according to various embodiments.
Figure 8B:
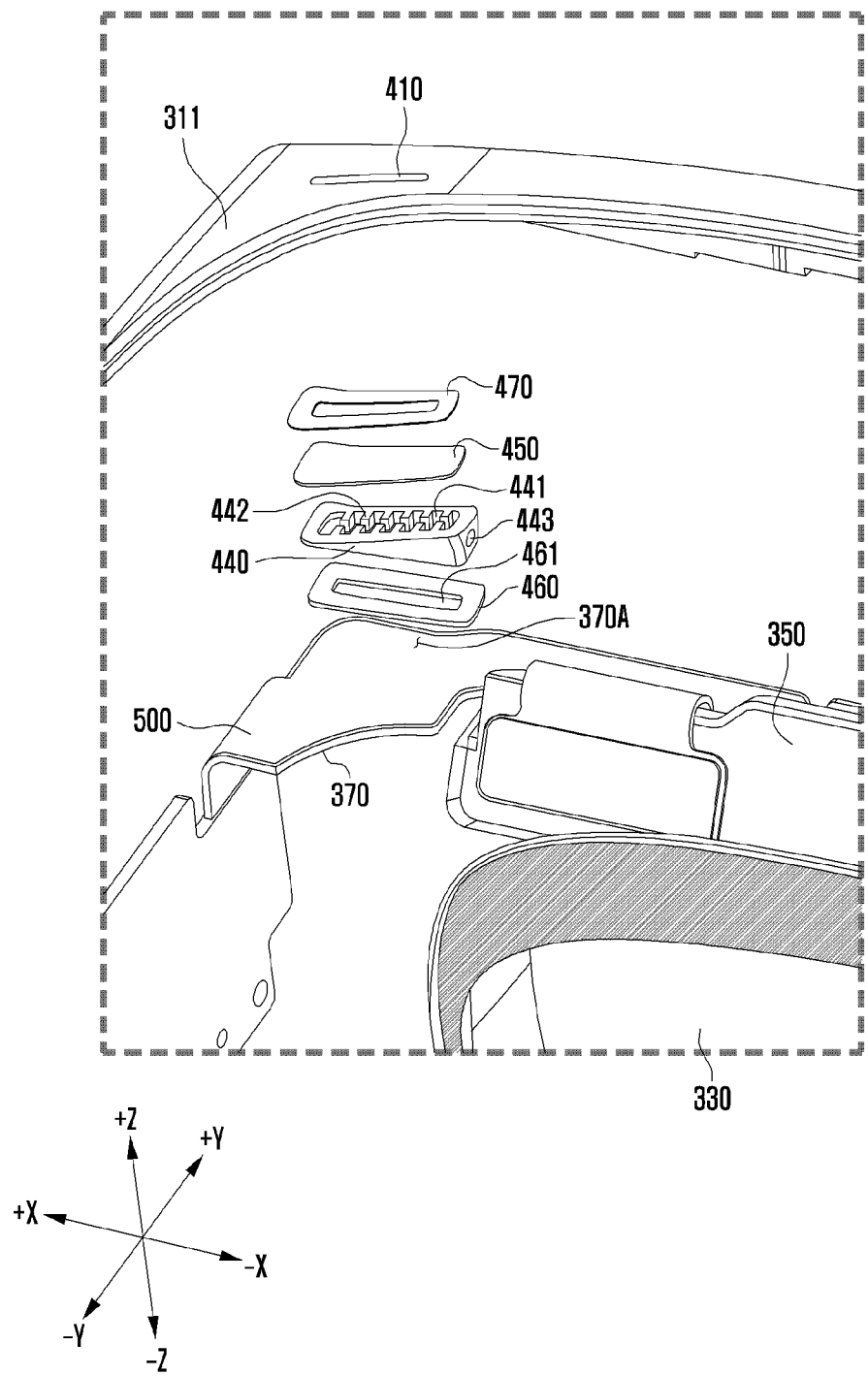
Figure 9:
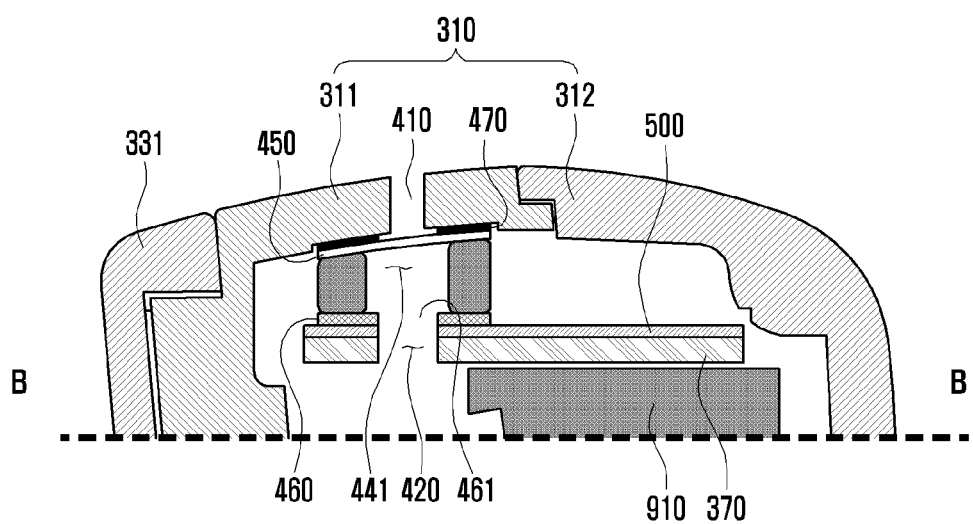
FIG. 9 is a cross-sectional view of an electronic device taken along line B-B of FIG. 4 according to various embodiments.

FIG. 7A is a perspective view illustrating the inside of an electronic device according to various embodiments. FIG. 7B is a perspective view illustrating shapes of a connection member and a heat dissipation member included in an electronic device according to various embodiments. FIG. 8A and FIG. 8B are exploded perspective views of a part of elements of an electronic device according to various embodiments. FIG. 9 is a cross-sectional view of an electronic device taken along line B-B of FIG. 4. FIGS. 10A, 10B, 10C and 10D are perspective views of a vent bracket according to various embodiments.

In the following description, the same reference numerals will be used for the components that are the same as or similar to the components described above with reference to FIG. 4 to FIG. 6, and detailed description thereof may not be repeated.

FIG. 7A and FIG. 7B are views illustrating the electronic device 400 in a state where some (e.g., the first rim housing 311) of the components of the exterior of the electronic device 400 are removed in order to explain the inside of the electronic device 400.

Referring to FIG. 7A, FIG. 7B, FIG. 8A, and FIG. 8B, an electronic device 400 may include a printed circuit board 390, a hinge device 360, a connection member 370, and a heat dissipation member 500.

In an embodiment, the printed circuit board 390 may be disposed in a temple 340 rotatably connected to the housing 310. Various electronic components (e.g., a processor (e.g., the processor in FIG. 1), a speaker module (e.g., the audio module 170 in FIG. 1), and an antenna module (e.g., the antenna module 197 in FIG. 1) whose temperature rises due to operation may be arranged on the printed circuit board 390 disposed inside the temple 340.

In an embodiment, the temple 340 in which the printed circuit board 390 is disposed may be rotatably connected to the housing 310 via the hinge device 360. The hinge device 360 may include auxiliary means such as an elastic member and a magnetic member so as to assist the rotation of the temple 340 with respect to the housing 310. Since the temple 340 rotates with respect to the housing 310, the volume of the electronic device 400 is reduced as a whole, and the electronic device 400 may be changed into the state in which the electronic device can be easily stored.

In an embodiment, the connection member 370 may electrically connect the printed circuit board 390 and the display module 350. As illustrated in FIG. 7A, since the display module is disposed at the housing 310 and the printed circuit board 390 is disposed in the temple 340, the printed circuit board 390 may have one end connected to the printed circuit board 390 and may have a shape extending in a direction toward the housing 310. In an embodiment, the connection member 370 may be made of a flexible material. At least a part of the connection member 370 may pass by the hinge device 360 connecting the temple 340 and the housing 310. When the temple 340 rotates with respect to the housing 310, a part of the connection member, which is adjacent to the hinge device 360, may be deformed. The connection member 370 may be made of a flexible material which allows the deformation so that the electrical connection between the printed circuit board 390 and the display module 350 can be maintained even in such deformation. For example, the connection member 370 may include a flexible printed circuit board (FPCB) 390. In an embodiment, the connection member 370 may be in a state of being partially bent so as to connect the printed circuit board 390 and the display module 350. For example, referring to FIG. 7A and FIG. 7B, the printed circuit board 390 may be disposed to face the +X-axis direction with respect to FIG. 7A and the display module 350 may be disposed in the +Z direction with respect to FIG. 7A. In this case, as illustrated in FIG. 7A and FIG. 7B, the connection member 370 may be disposed inside the housing 310 while being partially bent.

In an embodiment, the connection member 370 may include a vent region 370A. Referring to FIG. 8A, the vent region 370A may refer to a partial region 370A facing the vent hole 410. A part of the connection member 370 connecting the display module 350 and the printed circuit board 390 may face the vent hole 410. This part will be referred to as the vent region 370A herein.

In an embodiment, the vent region 370A may be a region of the connection member 370, which is formed in a region substantially parallel to the plane (+XY plane) on which the vent hole 410 is disposed. For example, the connection member 370 may include the vent region 370A substantially parallel to the plane (+XY plane) on which the vent hole 410 is disposed and a region substantially not parallel to the plane (+XY plane) on which the vent hole 410 is disposed. For example, the connection member 370 may be made of a flexible material. A part of the connection member 370 may be bent and a part of the connection member 370 may be arranged to be substantially parallel to the vent hole 410, and the other part of the connection member 370 may be arranged not to be parallel to the vent hole 410.

In various embodiments the heat dissipation member 500 may be disposed on the connection member 370. The heat dissipation member 500 may be made of a material having high thermal conductivity. As illustrated in FIG. 7B, the heat dissipation member 500 may be configured in a sheet shape and attached to one surface and/or the other surface of the connection member 370 to be arranged on the connecting member 370. The heat dissipation member 500 may be, for example, a graphite sheet. The heat dissipation member 500 may be attached to only one surface of the connection member 370, or may be attached to both surfaces of the connection member 370.

In an embodiment, as illustrated in FIG. 8A, a part of the heat dissipation member 500 may cover the vent region 370A. A part of the heat dissipation member 500 may face the vent hole 410. In an embodiment, the heat dissipation member 500 may be configured to extend so as to cover a region of the printed circuit board 390 electrically connected to the connection member 370. For example, at least a part of the heat dissipation components arranged on the printed circuit board 390 may be in direct contact with the heat dissipation member 500. In another example, a shield can which is made of a metallic material and disposed to cover a heat dissipation component may be disposed on the printed circuit board 390. The heat dissipation member 500 may be disposed to cover a part of the shield can.

The heat generated by the operation of the heat-emitting component arranged on the printed circuit board 390 may be transferred to the heat radiating member 500. The heat capacity is increased by the heat dissipation member 500, and the temperature rise can be partially suppressed.

In an embodiment, as illustrated in FIG. 8A, the heat dissipation member 500 may pass by the vent region 370A of the connection member 370 facing the vent hole 410. Outside the electronic device 400, air having a relatively low temperature can flow in through the vent hole 410, compared with the air existing inside the electronic device 400, may flow in through the vent hole 410. The temperature of the heat dissipation member 500 may be rapidly lowered by the outside air flowing through the vent hole 410, and the heat of the heat-emitting component transmitted to the heat dissipation member 500 may be effectively eliminated. When the temperature of the heat dissipation member 500 rises due to the heat-emitting component, the temperature of the air (inside air) around the heat dissipation member may rise. Since the heat dissipation member 500 is adjacent to the vent hole 410, the temperature of the air inside the electronic device 300 may rise around the vent hole 410. Since the difference between the internal air temperature and the external air temperature increases due to the increase of the temperature of the internal air of the electronic device 300 around the vent 410, the internal air and the external air circulation through the vent hole 410 can be performed more actively.

In various embodiments disclosed herein, the dissipation member 500 is attached to the connection member 370 configured to connect the printed circuit board 390 and the display module 350 and the connection member 370 is disposed to pass by a portion adjacent to the vent hole 410 through which the outside air is introduced so that the heat of the heat dissipation member 500 can be lowered by the outside air introduced through the vent hole 410. With this heat dissipation structure, the heat generated in the electronic device 400 may be effectively eliminated, and the frequency of performance deterioration (e.g., throttling) of the electronic device 400 due to the temperature rise may be reduced.

Referring to FIG. 8A and FIG. 9, an internal hole 420 may be disposed in the connection member 370 and the heat dissipation member 500. The internal hole 420 may be an opening disposed in a vent region 370A of the connection member 370 facing the vent hole 410. The internal hole 420 may be an opening configured such that the outside air introduced through the vent hole 410 is smoothly transmitted to the inside of the electronic device 400. The inside air in the electronic device 400 may be smoothly moved to the vent hole 410 through the internal hole 420.

In an embodiment, as illustrated in FIG. 9, the connection member 370 may be at least partially supported by a support mechanism 910 disposed inside the housing 310.

In various embodiments, a vent bracket 440 may be disposed between the vent hole 410 and the heat dissipation member 500. The vent bracket 440 may include a vent channel 441 connected to the vent hole 410. The vent channel 441 may be a space disposed inside the vent bracket 440. In an embodiment, referring to FIG. 8A and FIG. 9, the vent channel 441 of the vent bracket 440 may connect the vent hole 410 and the internal hole 420. In an embodiment, as illustrated in FIG. 8B, the vent bracket 440 may further include a connection hole 443 connected to the vent channel 441. The connection hole 443 may be disposed on one side of the vent 5 bracket 440 to be connected to the vent channel 441. When the vent bracket 440 including the connection hole 443 is used, the vent hole 410 and the internal space of the electronic device 400 may be connected by the connection hole 443 connected to the vent channel 441. In an embodiment, the internal hole 420 may not be disposed in the connection member 370 and the heat dissipation member 500.

In an embodiment, the vent bracket 440 may be made into a unidirectionally inclined shape. For example, as illustrated in FIG. 8A, the length thereof may become lower toward the +X direction. The shape of the vent bracket 440 may be due to the shape of the component (e.g., the first rim housing 311 in which the vent hole 410 is disposed) which the vent bracket 440 faces. As illustrated in FIG. 8A, 5 the first rim housing 311 in which the vent hole 410 is disposed may be configured to be inclined in one direction (e.g., the +X direction in FIG. 8A). The vent bracket 440 may be made to have an inclined shape to correspond to the shape of the first rim housing 311.

Figure 10A:
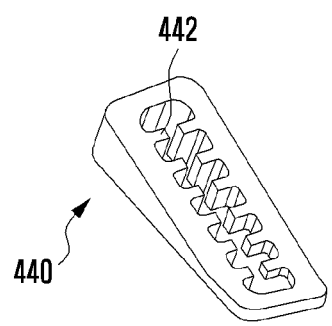
FIG. 10A, 10B, 10C and FIG. 10D are perspective views of a vent bracket according to various embodiments.
Figure 10B:
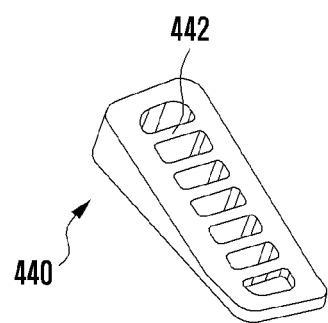
Figure 10C:
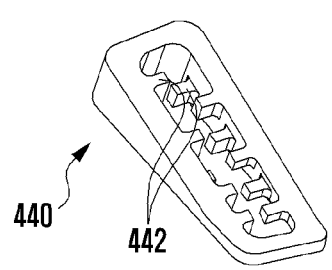
Figure 10D:
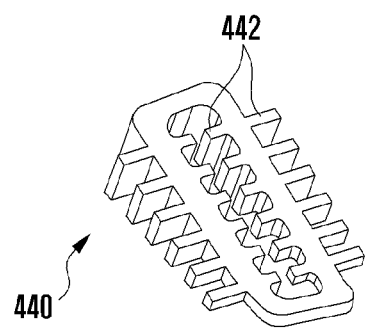

In an embodiment, the vent bracket 440 may be made of a material having high thermal conductivity. For example, the vent bracket 440 may be made of a metallic material such as aluminum. As illustrated in FIG. 10A to FIG. 10D (e.g., FIGS. 10A, 10B, 10C and 10D), the vent bracket may include a plurality of corrugations 422. The plurality of corrugations 422 arranged on the vent bracket 440 may be configured to increase the surface area of the vent bracket 440. The vent bracket 440 including the plurality of corrugations 442 may increase the heat dissipation efficiency (or heat exchange efficiency). The outside air introduced into the vent bracket 440 and the heat of the vent bracket 440 may be exchanged so that the heat transferred to the vent bracket 440 is dissipated. For example, the corrugations 442 may be, as illustrated in FIG. 10A, configured on an inner surface (e.g., the vent channel 441) of the vent bracket 440, and as illustrated in FIG. 10D, may be configured on an outer surface of the vent bracket, and may be configured on an inner surface and an outer surface of the vent bracket 440. The corrugations 422 arranged on the inner surface of the vent bracket 440 may be connected to each other to divide the vent channel 441 into a plurality of sections as illustrated in FIG. 10B, the corrugations 422 arranged on the inner surface thereof may be aligned with each other as illustrated in FIG. 10A, or the corrugations 422 arranged on the inner surface thereof may be arranged to be offset from each other as illustrated in FIG. 10C. In addition to this, the corrugations 442 may be arranged on the vent bracket 440 in various forms.

In an embodiment, the vent bracket 440 may be adhered and fixed to the heat dissipation member 500 by an adhesive member 460 having high thermal conductivity so that the heat of the heat dissipation member 500 is effectively transferred to the vent bracket 440. For example, a thermal interface material (TIM) 460 may be disposed between the vent bracket 440 and the heat dissipation member 500 to attach the vent bracket 440 to the heat dissipation member 500. The heat transferred to the heat dissipation member 500 may be transferred to the vent bracket 440 via the TIM 460. The outside air flowing in through the vent hole 410 and the heat of the vent bracket 440 are exchanged to dissipate heat. Referring to FIG. 9, the vent channel 441 of the vent bracket 440 and the internal hole 420 may be connected via the hole 461 formed in the TIM 460.

In an embodiment, a waterproof member 450 may be disposed between the vent bracket 440 and the vent hole 410. The waterproof member 450 may be made of a material which allows air to pass through and blocks foreign matter and moisture. For example, the waterproof member 450 may be made of a synthetic resin material such as Gore-Tex. The waterproof member 450 may be adhered and fixed to one surface of the vent bracket 440. In an embodiment, the waterproof member 450 may be adhered and fixed to one surface of the housing 310 via an adhesive member 470.

The heat dissipation structure disclosed herein, may include a structure in which the heat generated by the heat-emitting component disposed on the printed circuit board 390 is transferred to the heat dissipation member 500 connecting the printed circuit board 390 and the display module 350 and attached to the connection member 370 passing by the vent hole 410, the heat is transferred to the vent bracket 440 thermally connected to the heat dissipation member 500 via the TIM 460, and the outside air introduced through the vent hole 410 is heat-exchanged with the heat of the vent bracket 440 so that the heat is effectively dissipated.

As in the electronic device 400 disclosed herein, the electronic device 400 wearable on the body of a user may have less space for arranging components thereinside in order to reduce the volume thereof and may limit the use of a material having high thermal conductivity in order to reduce the weight thereof due to its characteristics. In the heat dissipation structure according to various embodiments disclosed herein, the heat dissipation member 500 is arranged on the connection member 370 which interconnects the electric objects so that the heat can be effectively diffused even in a relatively narrow space to partially eliminate the heat generation. Since the heat dissipation member 500 may come into close contact with the vent hole 410 into which the outside air flows and the heat may be dissipated by the outside air having a relatively low temperature, effective heat dissipation can be performed in the electronic device 400 in which the use of heat dissipation material is limited.

Although it is illustrated that the TIM 460, the vent bracket 440, and the waterproof member 450 are laminated between the vent hole 410 and the heat dissipation member 500 in FIG. 8A and FIG. 8B, but the laminated structure is merely an example, and at least one of the described elements may be omitted. For example, the vent bracket 440 may be omitted. In this case, the vent hole 410 and the heat dissipation member 500 may be directly connected via the TIM 460.

However, the heat dissipation structure disclosed herein is not be used only for a wearable electronic device, and may also be applied to various forms of electronic devices such as a general bar-type electronic device (e.g., the electronic 1100 in FIG. 11), a foldable electronic device (e.g., the electronic device 1200 in FIG. 12), and a rollable (slidable) electronic device.

Figure 11:
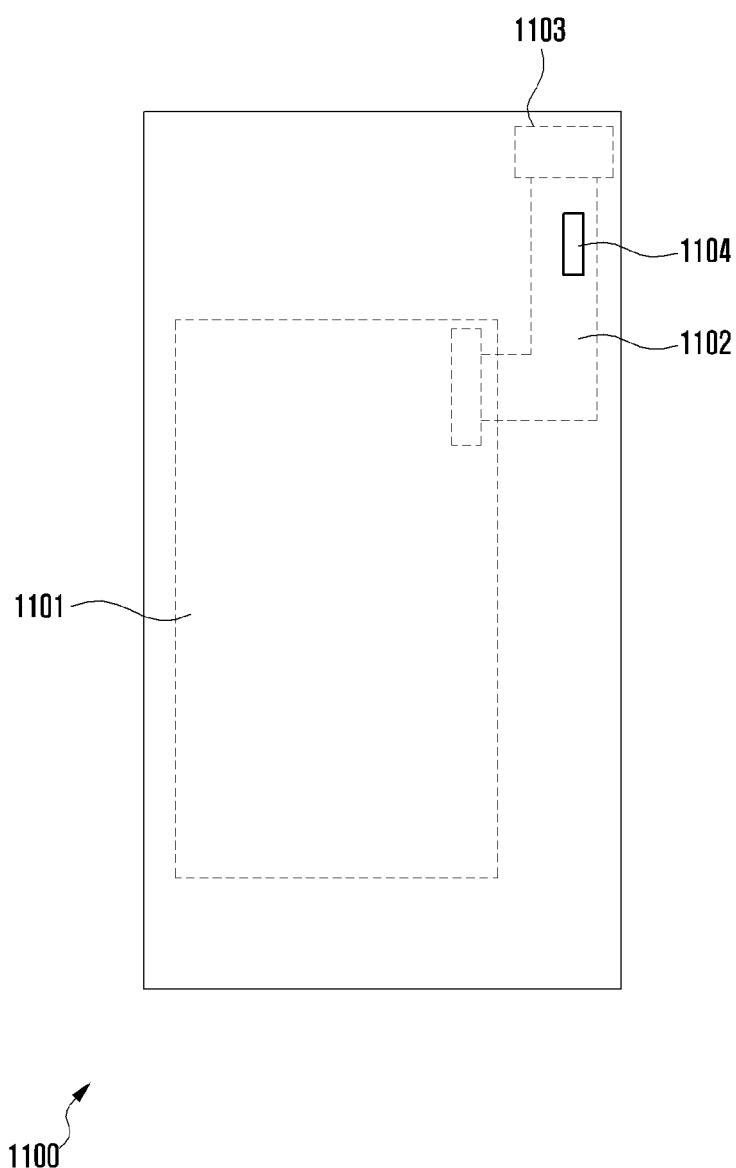
FIG. 11 and FIG. 12 are diagrams illustrating an example electronic device according to various embodiments.
Figure 12:
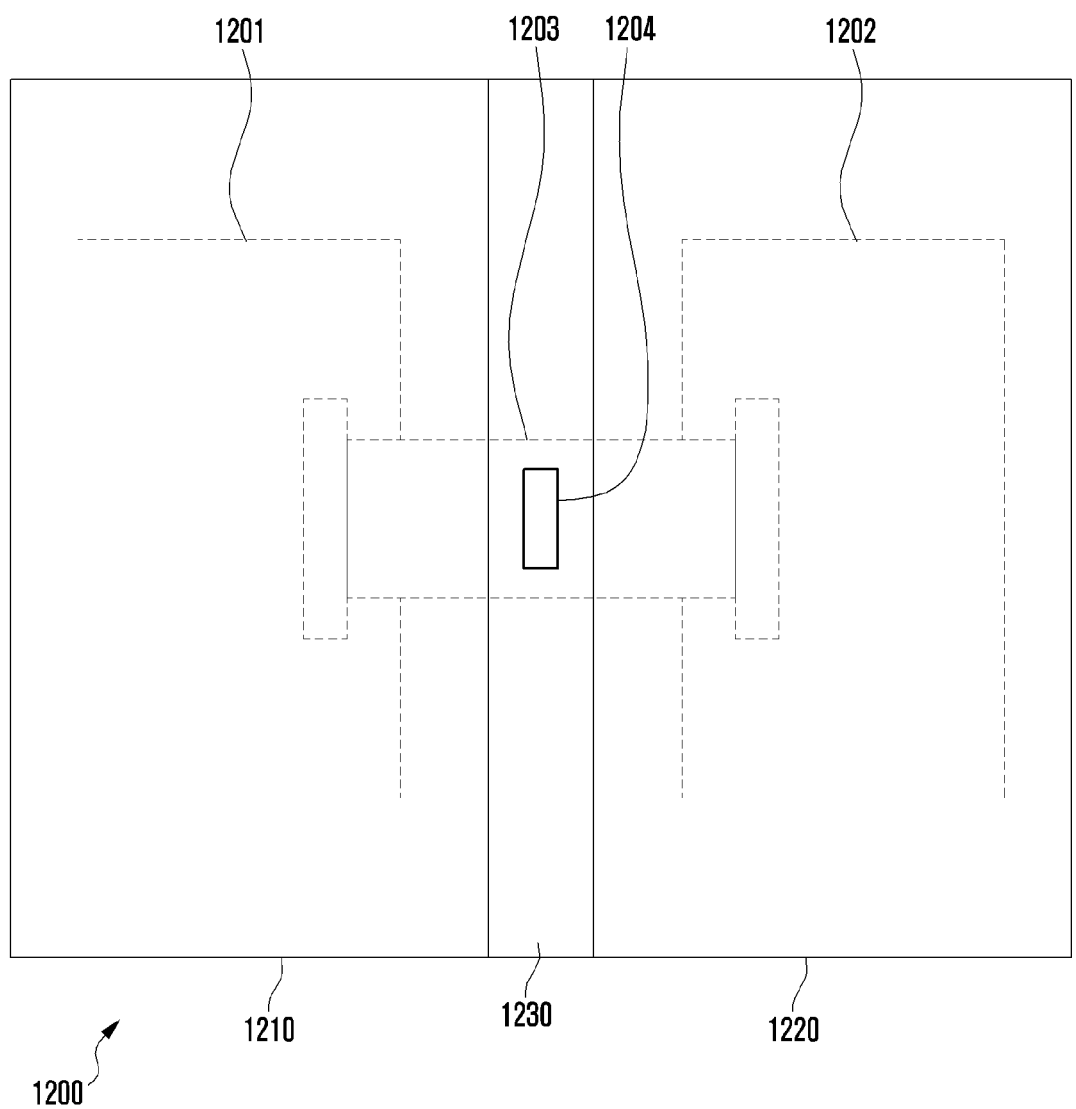

FIG. 11 and FIG. 12 are schematic diagrams illustrating an example electronic device according to various embodiments.

Referring to FIG. 11, an electronic device 1100 may include a printed circuit board 1101 on which a heat-emitting component such as a processor (e.g., the processor 120 in FIG. 1) is disposed. The electronic device 1100 may include electronic components 1103 such as a sensor, a camera, an audio device, and a connection interface. These electronic components 1103 need to be electrically connected to the printed circuit board 1101. A part of electronic components 1103 may be arranged at a part spaced apart from the printed circuit board 1101. The electronic components 1103 arranged to be spaced apart from the printed circuit board 1101 may be electrically connected to the printed circuit board 1101 by a connection member 1102 such as a flexible printed circuit board. A heat dissipation member (e.g., the heat dissipation member 500 in FIG. 7A and FIG. 7B) may be disposed at the connection member 1102 and a part of the connection member 1102 may be disposed to pass by a vent hole 1104 which connects the external space and the internal space of the electronic device 1200 so that the heat transferred to the heat dissipation member disposed at the connection member 1102 is dissipated by the outside air introduced through the vent hole 1104.

Referring to FIG. 12, the foldable electronic device 1200 may include an electronic device in which a first housing 1210 and a second housing 1220 are rotatably connected. The electronic device may include a connection member 1203, such as a flexible circuit board, which can electrically connect an electrical object 1201 disposed in the first housing 1210 and an electrical object 1202 disposed in the second housing 1220. In the foldable electronic device 1200, the connection member 1203 which connects the electrical object 1201 disposed in the first housing 1210 and the electrical object 1202 disposed in the second housing 1220 may pass by a housing (e.g., the hinge housing 1230 in FIG. 12) disposed between the first housing 1210 and the second housing 1220. The first housing 1210 and the second housing 1220 may be, for example, rotatably connected by a hinge device (not illustrated), and the hinge housing 1230 may be a housing which accommodates the hinge device. The vent hole 1204 may be disposed in the hinge housing 1230 and the connection member 1203 in which the connection member is disposed may be disposed to pass by the vent hole 1204 disposed in the hinge housing 1230. The heat transferred to the dissipation member attached to the connection member 1203 may be dissipated by the outside air introduced through the vent hole 1204.

The electronic device 1100 and 1200 illustrated in FIG. 11 and FIG. 12 may include the vent structure and the heat dissipation structure of the electronic device 300 illustrated in FIG. 8A and FIG. 8B. For example, the electronic device 1100 and 1200 may include a vent bracket (e.g., the vent bracket 440 in FIG. 8A), and the vent bracket may be adhered and fixed to the heat dissipation member disposed at the connection member 1102 and 1203 by a TIM (e.g., the TIM 460 in FIG. 8A).

In addition to this, the heat dissipation structure presented herein may be applied to various electronic devices.

A wearable electronic device (e.g., the electronic device 200 in FIG. 2 and the electronic device 300 in FIG. 4) according to various example embodiments disclosed herein may include: a housing (e.g., the housing 310 in FIG. 4), a printed circuit board (e.g., the printed circuit board 390 in FIG. 7A) on which a processor is disposed, a display module including a display (e.g., the display module 350 in FIG. 5), a vent hole (e.g., the vent hole 410 in FIG. 4) disposed in the housing, a connection member comprising a conductor (e.g., the connection member 370 in FIG. 7A) which includes a vent region (e.g., the vent region 370A in FIG. 8A) facing the vent hole and electrically connecting the printed circuit board and the display module, a heat dissipation member comprising a (e.g., the heat dissipation member 500 in FIG. 7B) material having high thermal conductivity and disposed at the connection member such that at least a part thereof covers at least a part of the vent region, and a vent bracket (e.g., the vent bracket 440 in FIG. 8A) including a vent channel (e.g., the vent channel 441 in FIG. 8A) connected to the vent hole and disposed between the heat dissipation member and the vent hole.

The wearable electronic device may further include an internal hole (e.g., the internal hole 420 in FIG. 8A) disposed in the heat dissipation member and the vent region of the connection member, wherein the vent channel of the vent bracket may connect the vent hole and the internal hole.

The vent bracket may further include a connection hole (e.g., the connection hole 443 in FIG. 8B) connecting the vent channel and the inner space of the wearable electronic device.

The vent bracket may be adhered and fixed to the heat dissipation member by an adhesive member including an adhesive material and (e.g., the adhesive member 460 in FIG. 8A) having high thermal conductivity.

The wearable electronic device may further include a waterproof member comprising a waterproof material (e.g., the waterproof member 450 in FIG. 8A) disposed between the vent hole and the vent bracket configured to block foreign matter and moisture introduced through the vent hole.

The vent bracket may comprise a material having high thermal conductivity and may have corrugations (e.g., the corrugations 442 in FIG. 8A) disposed on at least one of an inner surface and an outer surface of the vent bracket to increase the surface area of the vent bracket.

The connection member may include a flexible printed circuit board.

The wearable electronic device may further include a temple (e.g., the temple 340 in FIG. 4) in which the printed circuit board is disposed and a hinge (e.g., the hinge device 360 in FIG. 7A) rotatably connecting the temple and the housing, wherein the connection member is configured to extend from the temple to the housing.

The heat dissipation member may be disposed on at least one of one surface of the connection member and the other surface opposite to the one surface.

The wearable electronic device may further include an optical unit comprising a visor (e.g., the optical unit 330 in FIG. 5) supported by the housing and configured to transfer the light generated by the display module to the eye of a user.

The vent hole may face a direction substantially perpendicular to a direction in which the optical unit faces.

The housing may be configured to be inclined in one direction, and the vent bracket may be configured to be inclined to correspond to the direction in which the housing is inclined.

The heat dissipation member may be configured to cover at least a part of the printed circuit board.

The wearable electronic device may further include a shield can disposed on the printed circuit board to cover the processor disposed on the printed circuit board, wherein the heat dissipation member may be configured to cover the shield can.

An electronic device (e.g., the electronic device 1100 in FIG. 11 and the electronic device 1200 in FIG. 12) according to various example embodiments may include: a housing (e.g., the housing 1210 and 1220 in FIG. 12), a printed circuit board (e.g., the printed circuit board 1101 in FIG. 11) on which a processor is disposed, an electronic component (e.g., the electronic component 1103 in FIG. 11) disposed to be spaced apart from the printed circuit board, a vent hole (e.g., the vent hole 1104) in FIG. 11 and the vent hole 1204 in FIG. 12) disposed in the housing, a connection member comprising a conductor (e.g., the connection member 1102 in FIG. 11 and the connection member 1203 in FIG. 12) and including a vent region (e.g., the vent region 470A in FIG. 8A) facing the vent hole and electrically connecting the printed circuit board and the electronic components, and a heat dissipation member comprising (e.g., the heat dissipation member 500 in FIG. 7B) a material having high thermal conductivity disposed in the connection member such that at least a part thereof covers the vent region.

The electronic device may further include a vent bracket (e.g., the vent bracket 440 in FIG. 8A) including a vent channel (e.g., the vent channel 441 in FIG. 8A) connected to the vent hole and is disposed between the heat dissipation member and the vent hole.

The electronic device may further include an internal hole (e.g., the internal hole 420 in FIG. 8A) disposed in the heat dissipation member and the vent region of the connection member, wherein the vent channel of the vent bracket may connect the vent hole and the internal hole.

The vent bracket may further include a connection hole (e.g., the connection hole 443 in FIG. 8B) connecting the vent channel and the inner space of the electronic device.

The vent bracket may be adhered and fixed to the heat dissipation member by an adhesive member comprising an adhesive material (e.g., the adhesive member 460 in FIG. 8A) having high thermal conductivity.

The electronic device may further include a waterproof member comprising a waterproof material (e.g., the waterproof member 450 in FIG. 8A) disposed between the vent hole and the vent bracket to block foreign matter and moisture introduced through the vent hole.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A wearable electronic device comprising:
   a housing;
   a printed circuit board on which a processor is disposed;
   a display module;
   a vent hole formed in the housing;
   a connection member comprising a conductor and including a vent region facing the vent hole and electrically connecting the printed circuit board and the display module;
   a heat dissipation member comprising a thermally conductive material disposed at the connection member and at least a part of which covers at least a part of the vent region; and
   a vent bracket including a vent channel connected to the vent hole and disposed between the heat dissipation member and the vent hole,
   wherein the heat dissipation member is disposed on at least one of one surface of the connection member and an other surface opposite to the one surface.

2. The wearable electronic device of claim 1, further comprising an internal hole disposed in the heat dissipation member and the vent region of the connection member,
   wherein the vent channel of the vent bracket connects the vent hole and the internal hole.

3. The wearable electronic device of claim 1, wherein the vent bracket further includes a connection hole connecting the vent channel and an internal space of the wearable electronic device.

4. The wearable electronic device of claim 1, wherein the vent bracket is adhered and fixed to the heat dissipation member by an adhesive member comprising an adhesive material and having high thermal conductivity.

5. The wearable electronic device of claim 1, further comprising a waterproof member comprising a waterproof material disposed between the vent hole and the vent bracket configured to block foreign matter and moisture introduced through the vent hole.

6. The wearable electronic device of claim 1, wherein the vent bracket comprises a material having high thermal conductivity and has corrugations arranged on at least one of an inner surface and an outer surface of the vent bracket configured to increase the surface area of the vent bracket.

7. The wearable electronic device of claim 1, wherein the connection member includes a flexible printed circuit board.

8. The wearable electronic device of claim 1, further comprising:
   a temple in which the printed circuit board is disposed; and
   a hinge device including a hinge rotatably connecting the temple and the housing,
   wherein the connection member is configured to extend from the temple to the housing.

9. The wearable electronic device of claim 1, further comprising an optical unit including a visor supported by the housing and configured to transfer the light generated by the display module to the eye.

10. The wearable electronic device of claim 9, wherein the vent hole is disposed to face in a direction substantially perpendicular to a direction in which the optical unit faces.

11. The wearable electronic device of claim 1, wherein the housing is configured to be inclined in one direction, and
   wherein the vent bracket is configured to be inclined to correspond to the direction in which the housing is inclined.

12. The wearable electronic device of claim 1, wherein the heat dissipation member is configured to cover at least a part of the printed circuit board.

13. The wearable electronic device of claim 1, further comprising a shield can disposed on the printed circuit board to cover the processor disposed on the printed circuit board,
   wherein the heat dissipation member is configured to cover the shield can.

14. An electronic device comprising:
   a housing;
   a printed circuit board on which a processor is disposed;
   an electronic component disposed to be spaced apart from the printed circuit board;
   a vent hole formed in the housing;
   a connection member comprising a conductor and including a vent region facing the vent hole and electrically connecting the printed circuit board and the electronic component;
   a heat dissipation member comprising a thermally conductive material and disposed at the connection member and at least a part of which covers at least a part of the vent region; and
   a vent bracket including a vent channel connected to the vent hole and is disposed between the heat dissipation member and the vent hole,
   wherein the heat dissipation member is disposed on at least one of one surface of the connection member and an other surface opposite to the one surface.

15. The electronic device of claim 14, further comprising an internal hole disposed in the heat dissipation member and the vent region of the connection member,
   wherein the vent channel of the vent bracket connects the vent hole and the internal hole.

16. The electronic device of claim 14, wherein the vent bracket further includes a connection hole configured to connect the vent channel and the internal space of the electronic device.

17. The electronic device of claim 14, wherein the vent bracket is adhered and fixed to the heat dissipation member by an adhesive member comprising an adhesive and having high thermal conductivity.

18. The electronic device of claim 14, further comprising a waterproof member comprising a waterproof material disposed between the vent hole and the vent bracket configured to block foreign matter and moisture introduced through the vent hole.

\* \* \* \* \*